US005608234A

United States Patent [19]

Jiang

[11] Patent Number: 5,608,234

[45] Date of Patent: Mar. 4, 1997

[54] SEMI-INSULATING EDGE EMITTING LIGHT EMITTING DIODE

[75] Inventor: Ching-Long Jiang, Somerville, N.J.

[73] Assignee: The Whitaker Corporation, Wilmington, Del.

[21] Appl. No.: 606,498

[22] Filed: Feb. 23, 1996

Related U.S. Application Data

[63] Continuation of Ser. No. 390,151, Feb. 16, 1995, abandoned, which is a continuation of Ser. No. 339,053, Nov. 14, 1994, abandoned.

[51] Int. Cl.[6] ..... H01L 33/00

[52] U.S. Cl. ..... 257/94; 257/96; 257/97; 257/102; 257/103; 372/45; 372/46; 372/49

[58] Field of Search ..... 257/94, 95, 96, 257/97, 102, 103; 372/49, 46, 45

[56] References Cited

U.S. PATENT DOCUMENTS

| | | | |
|---|---|---|---|
| 4,210,923 | 7/1980 | North et al. | 357/30 |
| 4,637,122 | 1/1987 | Carney et al. | 437/127 |
| 4,660,208 | 4/1987 | Johnston, Jr. et al. | 437/129 |
| 4,692,926 | 9/1987 | Marschall et al. | 372/46 |
| 4,845,724 | 7/1989 | Hayakawa et al. | 372/45 |
| 5,003,358 | 3/1991 | Takahashi et al. | 257/99 |
| 5,018,159 | 5/1991 | Suzuki et al. | 372/46 |
| 5,084,893 | 1/1992 | Sekii et al. | 372/46 |
| 5,093,696 | 3/1992 | Kinoshita | 372/45 X |
| 5,100,833 | 3/1992 | Takahashi et al. | 437/129 |
| 5,122,844 | 6/1992 | Akiba et al. | 357/17 |
| 5,128,276 | 7/1992 | Ambrosius et al. | 437/129 |
| 5,135,877 | 8/1992 | Albergo et al. | 437/23 |
| 5,148,439 | 9/1992 | Wünstel et al. | 372/46 |
| 5,179,567 | 1/1993 | Uomi et al. | 372/46 |
| 5,194,399 | 3/1993 | Takahashi et al. | 437/129 |
| 5,272,106 | 12/1993 | Hirtz et al. | 437/129 |
| 5,275,968 | 1/1994 | Takahashi et al. | 437/905 X |
| 5,309,467 | 5/1994 | Terakado | 372/45 |
| 5,325,385 | 6/1994 | Kasukawa et al. | 372/46 |
| 5,345,464 | 9/1994 | Takemoto | 372/46 |
| 5,440,147 | 8/1995 | Kazmierski et al. | 437/127 |

FOREIGN PATENT DOCUMENTS

| | | | |
|---|---|---|---|
| 0276069 | 7/1988 | European Pat. Off. | C30B 25/02 |
| 0310019 | 4/1989 | European Pat. Off. | H01L 33/00 |
| 0372394 | 6/1990 | European Pat. Off. | H01L 33/00 |
| 260183 | 12/1985 | Japan | 437/127 |
| 0125886 | 5/1989 | Japan | H01L 33/00 |

OTHER PUBLICATIONS

"InGaAsP/InP Planar Buried Heterostructure Lasers with Semi-Insulating InP Current Blocking Layers Grown by MOCVD; IEEE Journal of Quantum Electronics"; K. Wakao et al.; vol. QB-23; No. 6; Jun. 1987.

Journal of Crystal Growth; "Transition Metal Doping of LP-MOCVD-Grown InP"; T. Wolf et al.; 1991.

(List continued on next page.)

*Primary Examiner*—William Mintel
*Attorney, Agent, or Firm*—W. S. Francos

[57] ABSTRACT

Light emitting devices are requiring greater switching speeds to achieve greater modulation bandwidths. The problems of intrinsic capacitance associated with conventional semiconductor heterojunction devices are reduced by the reduction of pn junction capacitance as well as the use of a semi-insulating blocking layer and a conductive substrate. Furthermore, a light absorbing layer is disposed on one side of an unetched portion of the semi-insulating material and an active layer disposed on an opposite side of the unetched portion. Also, the interface of the semi-insulating material and the active and absorbing layers are at prescribed angles that reduce back reflections to the absorbing and active layers. This arrangement reduces pumping in the absorbing region and thus reduces the lasing effect, allowing for a stable LED. The angle at the interface is determined by having the structure at a predetermined crystallographic direction and having the semi-insulating material etched to reveal a predetermined crystalline plane.

11 Claims, 9 Drawing Sheets

OTHER PUBLICATIONS

*IEEE Journal of Quantum Electronics*; "Lateral npn Junction and Semi–Insulating GaAs Current Continement Structure for Index–Guided InGaAs/AlGaAs Lasers by Molecular Beam Epitaxy"; T. Takamori et al.; vol. 29; No. 6, Jun. 1993.

Inst. Phys. Conf. Ser. No. 91; Chapter 3; "Ti–Fe Co–doped semi–insulating InP grown by MOVPE"; A. Dentai et al.; 1987.

*Jouranl Applied Physics*; "Growth and Characterization of Fe–doped semi–insulating InP prepared by low–pressure organometallic vapor phase epitaxy with tertiarybutylphosphine" Rong–Ting Huang et al.; 1991.

"Cavity Length Dependence of Optical Characteristics in High Power Narrow Stripe GaAs Superluminescent Diodes"; IEEE Photonics Technology Letters; K. Imanka; vol. 2; No. 10; pp. 705–707; Oct. 1990.

"High Performance 1.3 μm Buried Crescent Lasers and LEDs for Fiber Optic Links"; SPIE Laser Diode Technology and Applications; R. J. Fu et al.; vol. 1043, pp. 221–225, Jan. 1988.

"High Output Power GaInAsP/InP Superluminescent Diode at 1.3 μm"; Electronics Letters; Y. Kashima et al.; vol. 24, pp. 1507–1508; Nov. 1988.

"InGaAsP/InP/InP Long Wavelength High Efficiency Edge Emitting LED for Single Mode Fiber Optic Communication"; Proceedings of FOC/LAN '87, pp. 379–382, Oct. 1987; T. Tsubota et al.

*IEEE Journal of Quantum Electronics*; "GaInAsP/InP Surface Emitting Injection Lasers With Short Cavity Length"; H. Soda et al.; vol. QE–19; No. 6; Jun. 1983.

*IEEE Journal Of Quantum Electronics*; "Circular Buried Heterostructure (CBH) GaAlAs/GaAs Surface Emitting Lasers"; S. Kinoshita et al., vol. QE–23; No. 6; Jun. 1987.

*Journal of Lightwave Technology*; "GaInAsP/InP Surface–Emitting Lasers With Current Confining Structure"; S. Uchiyama et al.; vol. LT–4; No. 7; Jul. 1986.

*Applied Physics Letter*; "Resonant Cavity Light–Emitting Diode"; E. F. Schubert et al.; vol. 60, No. 8; Feb. 24, 1992.

*IEEE Photonics Technology Letters*; "Resonant Cavity Light Emitting Diode And Detector Using Epitaxial Liftoff"; B. Corbett et al.; vol. 5, No. 9, Sep. 1993.

*American Electroplaters And Surface Finishers Society, Inc. 80th Annual Conference–Anaheim*; "Novel Plating Technique On Electrically Isolated Mesas With Non–Planar Surface"; Ching–Long Jiang; 1993.

*Sumitomo Electric Technical Review*; "Development of Mesa LEDs for 1 Gbps Fiberoptic Communications"; K. Ogata et al.; No. 34; Jun. 1992.

Sasaki et al, "A 2.5 mA Threshold Current Operation and 5 G bit/s Zero–Bias Current Modulation of 1.5–μm MQW–DFB Laser Diodes," Optical Fiber Communication Conference, 22–26 Jan. 1990, Optical Society of America, Wash., D.C. 1990.

Miller et al, "Tertiarybutlylarsine as a Substitute for $AsH_3$: Application To InGaAs/InP Photonic Integrated Circuits," Second International Conference: Indium Phosphide and Related Materials, Apr. 23–25, 1990, Denver, Colo., IEEE 1990, pp. 161–164.

Sasaki et al, "A 2.5–mA Threshold Current Operation and 5–Gbit/s Zero–Bias–Current Modulation of 1.5–μm MQW–DFB Laser Diodes" Optical Fiber Communication Conference, 1990 Technical Digest Series, vol. 1, Conference Edition, Jan. 22–26, 1990, San Francisco, CA p. 213.

SEMI-INSULATING EDGE EMITTING LIGHT EMITTING DIODE

This application is a Continuation of application Ser. No. 08/390,151 filed Feb. 16, 1995, now abandoned, in turn, a Continuation of application Ser. No. 08/339,053 filed Nov. 14, 1994, now abandoned.

FIELD OF THE INVENTION

The present invention relates to semiconductor light emitting devices with increased operating speed and near linear light output versus current input characteristics, and lasing suppression mechanisms.

BACKGROUND OF THE INVENTION

The invention of the instant application is related to U.S. patent applications Ser. Nos. 08/276,131 (abandoned); 08/572,284; and 08/338,991 (allowed). The advent of heterostructure semiconductor devices has lead to the ease in fabrication and improved characteristics of many types of semiconductor devices. The light emitting diode (LED) the subject of the present invention, is an example of a device that benefits greatly from the use of heterostructure device design. Generally, the heterostructure employed in the fabrication of an LED is a double heterostructure, in which an active region III–V semiconductor (ternary or quaternary) is sandwiched between two oppositely doped III–IV compounds. By choosing appropriate materials of the outer layers, the band gaps are made to be larger than that of the active layer. This procedure, well known to the skilled artisan, produces a device that permits light emission due to recombination in the active region, but prevents the flow of electrons or holes between the active layer and the higher band gap sandwiching layers due to the differences between the conduction band energies and the valence band energies, respectively. An example of this is shown in FIG. 1, which is an energy band diagram of an N-n-P (where N,P are indicative of materials with greater band gaps than the n-doped active region) double semiconductor heterostructure, which shows the discontinuities 2,3 in energy levels of the conduction band energy ($E_c$) and the valence band energy ($E_v$) at the depletion regions that create the confinement of electrons and holes in the active region 1 (The Fermi level $E_f$, is aligned at all three materials). The minority carrier concentration (holes) in the sandwiched region can have a magnitude comparable to the majority carrier concentration in the p-doped region. Accordingly, upon application of a junction forward bias, recombination takes place in and is essentially restricted to the central region, a feature of great advantage in the LED. A further advantage stems from a structure such as that shown, is that the dielectric constant of the higher bandgap layers is lower than that of the central lower bandgap region. Accordingly, the index of refraction of the lower bandgap region is higher than that of the lower bandgap regions, and a natural dielectric slab (assuming a rectangular layer structure) waveguide is formed.

Light emitting devices can be fabricated to emit light from an edge of the active layer, or as stated above, from a surface. The devices can be either light emitting diodes or lasers. For the purposes of clarity of instruction, one particular design will be described in detail. The particular design shows an edge emitting LED on an n-type substrate. However the same principles apply for these light emitting devices on a p-type substrate. Furthermore, the active layer composition for the these devices can be either of conventional bulk material or strained or unstrained quantum well type material. An Edge Emitting Light Emitting Diode (ELED), fabricated by conventional techniques is shown in FIGS. 2–4. Turning first to FIG. 2, a p-type indium phosphide (p-InP) layer 22 is grown on substrate 21. An n-InP cladding layer 23 is grown on the layer 22, and a v-groove is etched as shown with an active region of InGaAsP grown thereafter. Then, a p-cladding layer of InP 24 followed by a $p^+$ layer of InGaAsP contact 25 or cap layer. Then a metal contact layer 26 is deposited on layer 25. With the exception of the metal contact layer 26, these layers are grown on the substrate epitaxially. In the structure as shown, distinct advantages are realized. First, as with other conventional devices, the natural waveguide is formed by choosing the appropriate cladding and active layers. Also, a buried structure is formed which enables current confinement which results in a lower current threshold level, and reduced operating temperatures. This current confinement comes about by selective junction biasing. To be specific to the example shown, a forward bias at the active/cladding region results in emission through recombination. However, as can be appreciated, application of an electric potential to effect a forward bias from active to cladding will result in a reverse bias in the lateral pn junctions, thus electrically burying the active region and resulting in current confinement. Optical confinement is also effected by the fact that the lateral regions are of lower index of refraction than that of the active region, resulting in a guided optical wave. FIG. 3 shows a p-type substrate of InP 31 having a buried crescent active region of p-GainAsP 33 and cladding layers of n-InP 32 and p-InP 34 respectively. In the particular device shown, there is shown the interface of the cladding and substrate regions at 36 which is angled to reduce reflections thereby reducing the probability of lasing. In a device designed to be an LED, it is undesirable to have a resonant cavity capable of supporting lasing action, and this is one method used to prevent this. The blocking layer is shown as an n InP layer 37, a p In-P layer 38 and an n InP layer 39. Finally, turning to FIG. 4, the basic structure as shown in FIG. 3 is found, however, a thyristor blocking region 47 is shown that separates the active region 43 from an absorption region of material identical to that of the active region. A substrate of p-InP 41, has a layer 46 n-InP 42 grown on top and a layer of p-InP 46 layer grown on top of layer 42. The lower cladding region is shown as p-InP 44, and an upper cladding region of n-InP is shown at 40. Furthermore, a layer of p-InGaAsP 48 is identical to the active layer 43. In purpose and effect, such a structure is designed to absorb any light that is refracted at the interface 46 and propagates through the thyristor blocking layer 47. Potentially, this could effect resonating and thereby result in undesired lasing. The device shown in FIG. 4 also has a dielectric cap of $SiO_2$ which is supposed to reduce leakage current in the absorption region from the ohmic metal contact for the device which is deposited onto the top surface. The shortcoming of this approach is that there is still current leakage through the heavily doped cap layer of n-InGaAsP. This leakage current will result in electrical pumping of the absorption region of the LED, and accordingly, lasing effects could result. In addition, this leakage current (current flow from the absorption region) reduces the actual current needed to pump the active region. Furthermore, this structure, while effective in DC applications has great shortcomings in the ever increasing switching speeds required for example in communications applications. This is due to intrinsic capacitance between the layers that make up the device. Furthermore, the layer of dielectric which is used to decrease leakage current has the adverse affect of preventing heat dissipation as well as increasing device capacitance. It is desirable to reduce the area of the layers which reduces the capacitance, as well as to increase the ability to dissipate joule heating of the device.

With the desire for higher switching speeds, particularly the desire to reduce the rise and fall times of a digital optical signal, the ill-effects of parasitic capacitance must be reduced. Examples of attempts to curb the ill-effects of parasitic capacitance can be found in related U.S. Pat. Nos. 5,003,358; 5,100,833; 5,194,399 and 5,275,968 to Takahashi, et al. incorporated herein by reference. As is disclosed in the '358 reference, a semi-insulating or insulating substrate has deposited thereon a semi-insulating layer of InP which is etched to accommodate the p and n side electrodes as well as an vertical aperture in which an active layer is grown between p and n type cladding layers. Thereby, a light emitting device is formed in the aperture. Connecting the n-type cladding to the n side electrode is a conducting n-type InP layer which is buried in a groove etched in the semi-insulating layer. This structure having the light emitting device in a relatively small and confined region reduces the intrinsic parasitic capacitance by reducing the area of the p-n junctions of the device, and thereby the capacitance which is directly proportional to the area of the p-n junction. A good understanding of the ill-effects of this parasitic peripheral pn junction capacitance is found by a review of the prior art disclosed in FIG. 5 of the '358 reference. U.S. Pat. No. 5,309,467 to Terakado, the disclosure of which is specifically incorporated herein by reference, discloses a buried stripe semiconductor laser with a semi-insulating layer on either side of the buried mesa structure. This structure enables the operation of a laser with high luminous efficiency at elevated temperatures. This reference teaches the structure to effect lasing. What is desired is an LED which is capable of operating at high frequencies and at elevated temperatures.

SUMMARY OF THE INVENTION

The present invention provides for an edge emitting LED which is capable of operating at high frequencies, and thereby with a greater operational bandwidth. The invention effects light emission without the adverse affects of lasing by eliminating light diffusion surfaces and by having a nearly unpumped absorption region.

OBJECTS, FEATURES AND ADVANTAGES

It is an object of the present invention to enable an LED to operate with high switching speed, thereby with greater bandwidth capabilities.

It is a feature of the present advantage to fabricate a buried heterostructure device with greatly reduced intrinsic capacitance, thereby having a lower intrinsic RC time constant.

It is a further feature to reduce the lateral pn junction capacitance through the use of a semi-insulating material deposited on either side of the buried heterostructure.

It is a further feature of the present invention to prevent lasing by removal of portions of the cap, cladding and semi-insulating layers.

It is a further feature of the present invention to dissipate joule heat through the semi-insulating layer that reduces the intrinsic capacitance.

It is an object of the present invention to fabricate a high switching speed light emitting device that is not prone to lasing.

It is a further feature of the present invention to reduce the ill-effects of joule heating, and the subsequent non-linear light versus current characteristics.

FIGS. *5a–5f* show cross sectional views of the present invention based on a buried crescent structure.

FIGS. *6a–6f* show cross sectional views of the present invention based on a buried mesa heterostructure.

FIGS. *7a–7b* show an alternative fabrication step.

DETAILED DESCRIPTION OF THE PREFERRED EMBODIMENTS

Figure 1:
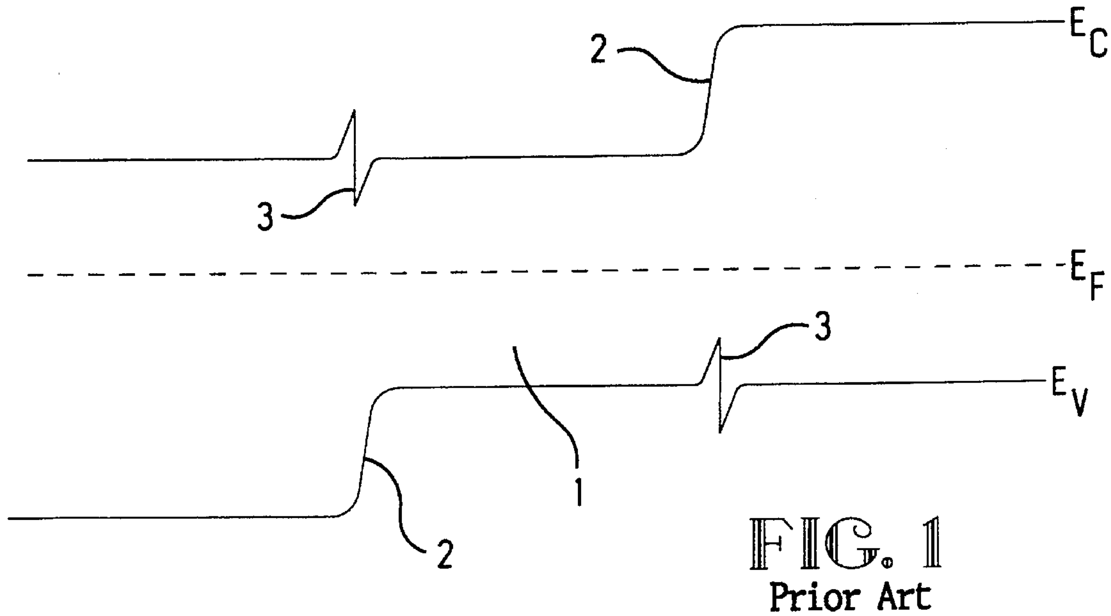
FIG. 1 is an example of an energy band diagram of a conventional double heterostructure junction with an active layer having a lower band gap than the outer layers.
Figure 2:
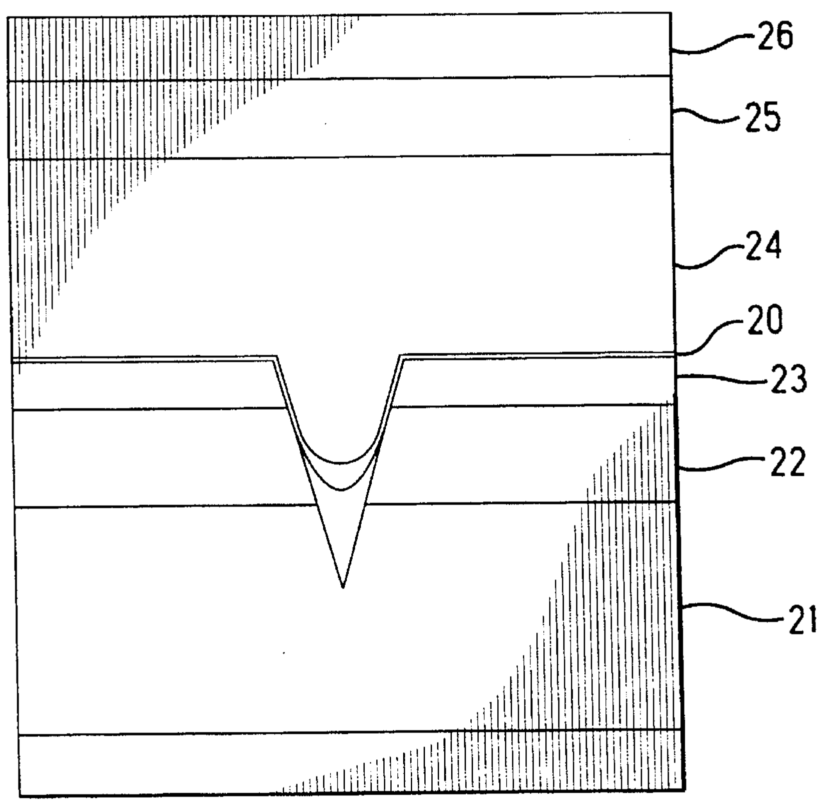
FIG. 2 is a schematic cross sectional view of a conventional ELED with a thyristor blocking layer.
Figure 3:
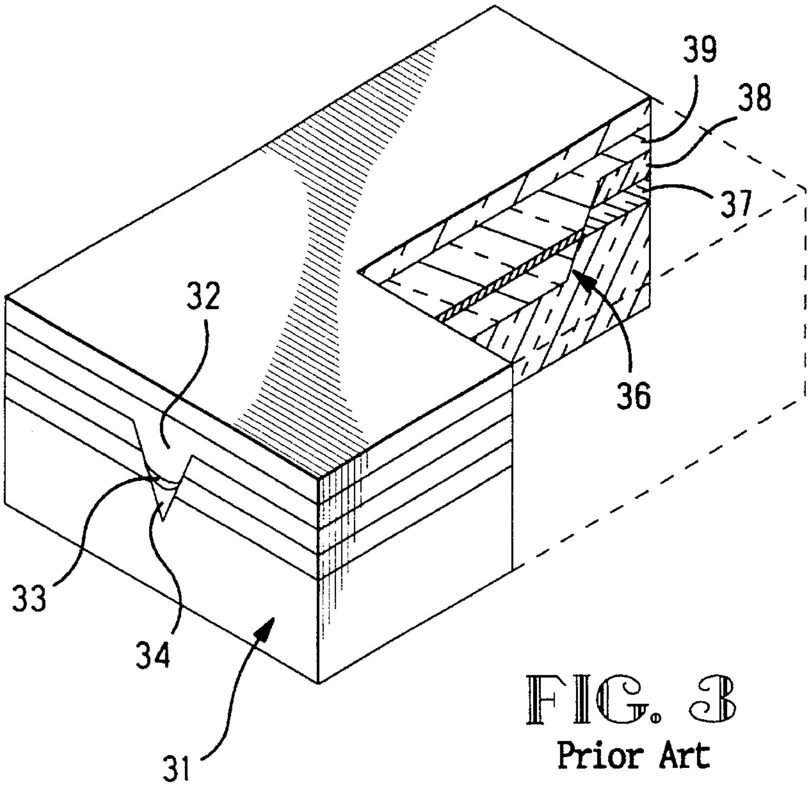
FIG. 3 is a cross sectional view of a conventional ELED with a thyristor blocking layer and a light diffusion surface.
Figure 4:
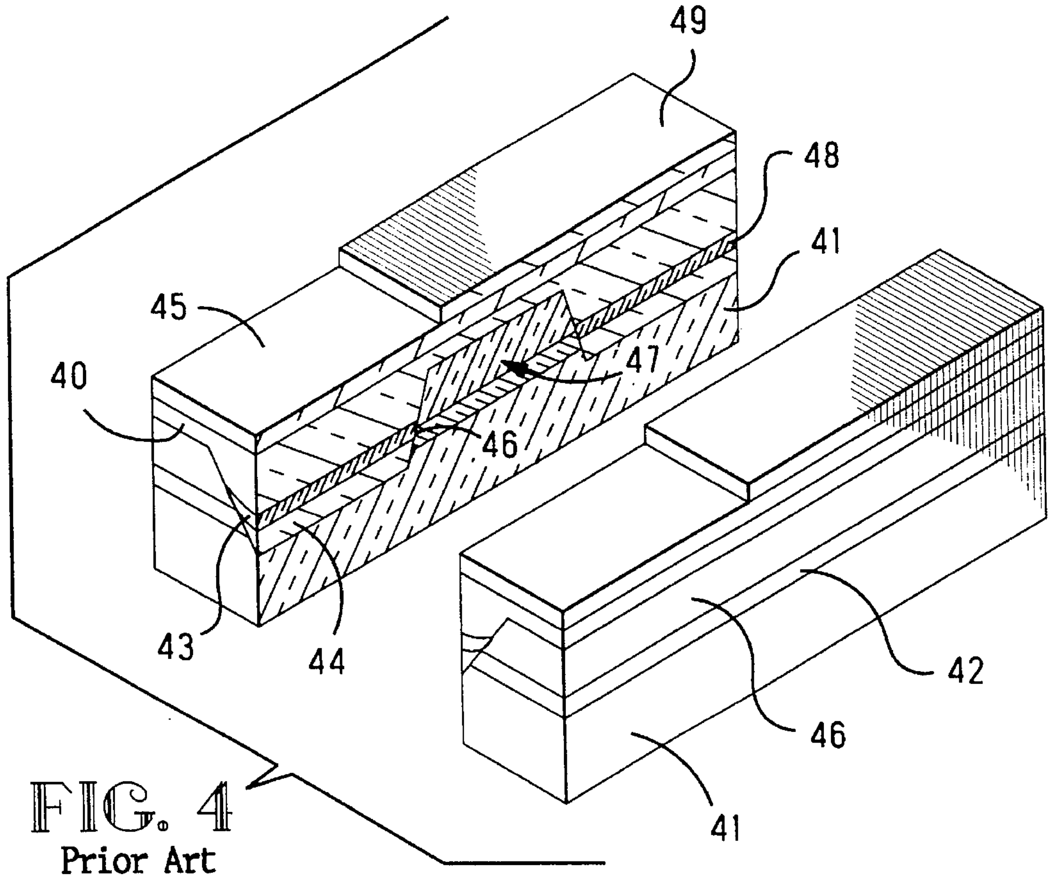
FIG. 4 is a cross-sectional view of a conventional ELED with a thyristor blocking layer, light diffusion surface and absorption layer.
Figure 5A:
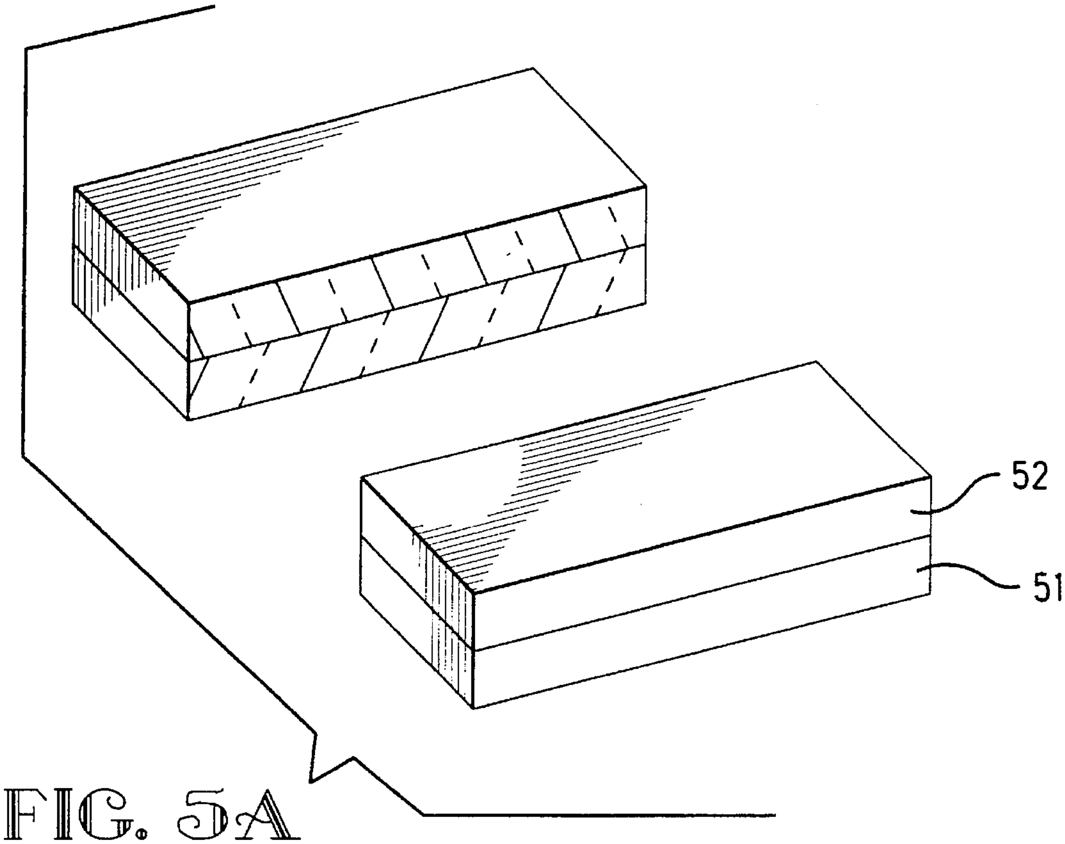
Figure 5B:
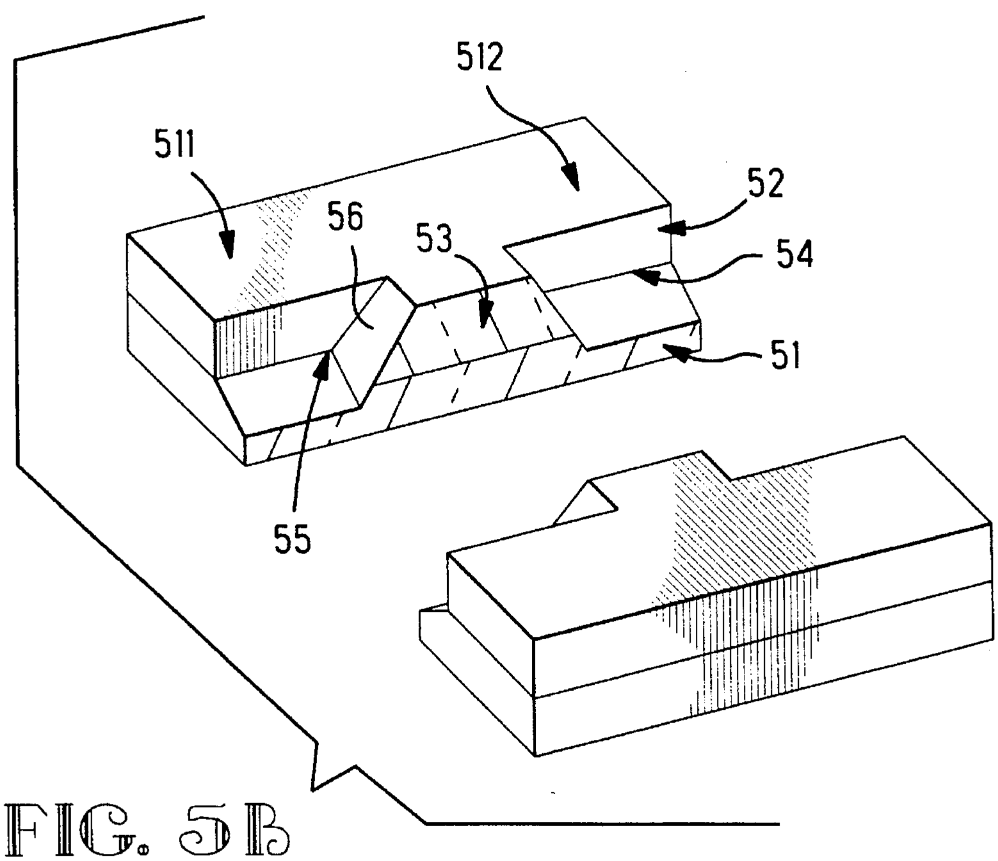
Figure 5C:
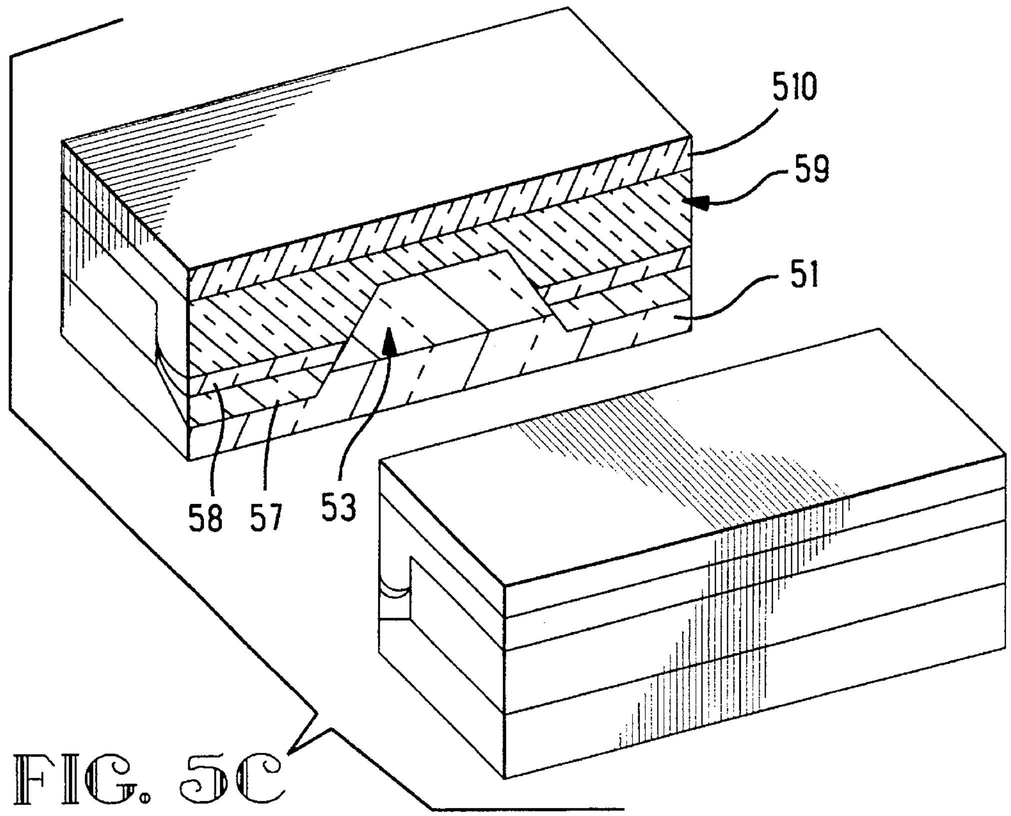
Figure 5D:
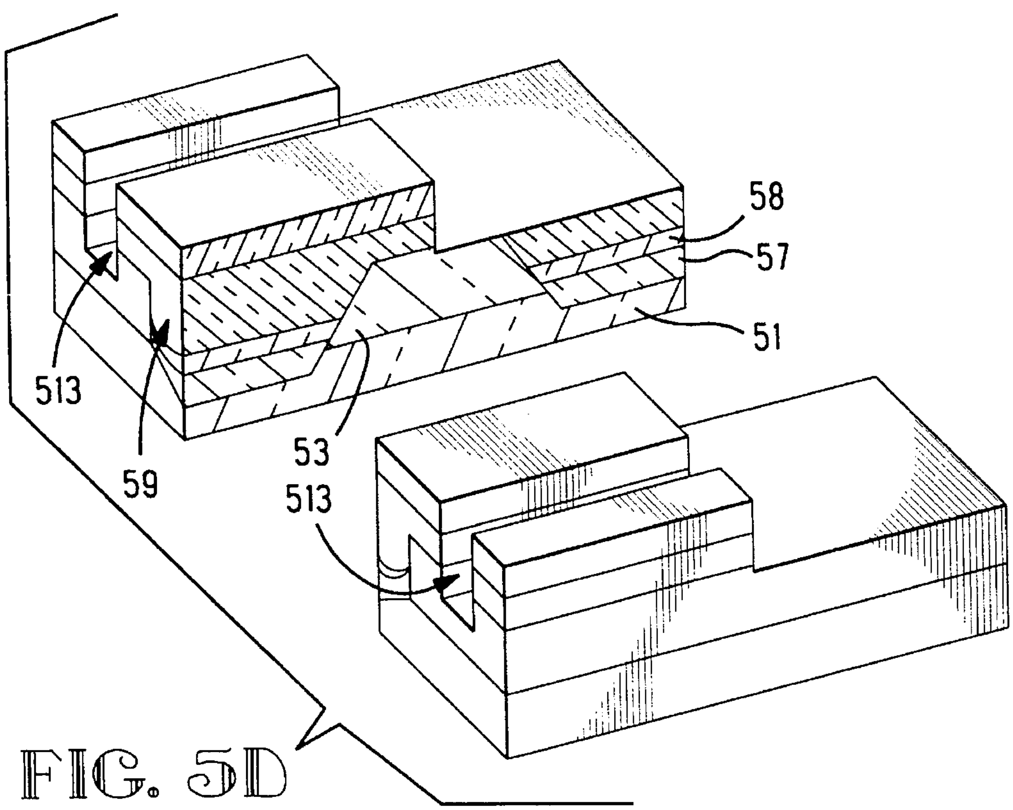
Figure 5E:
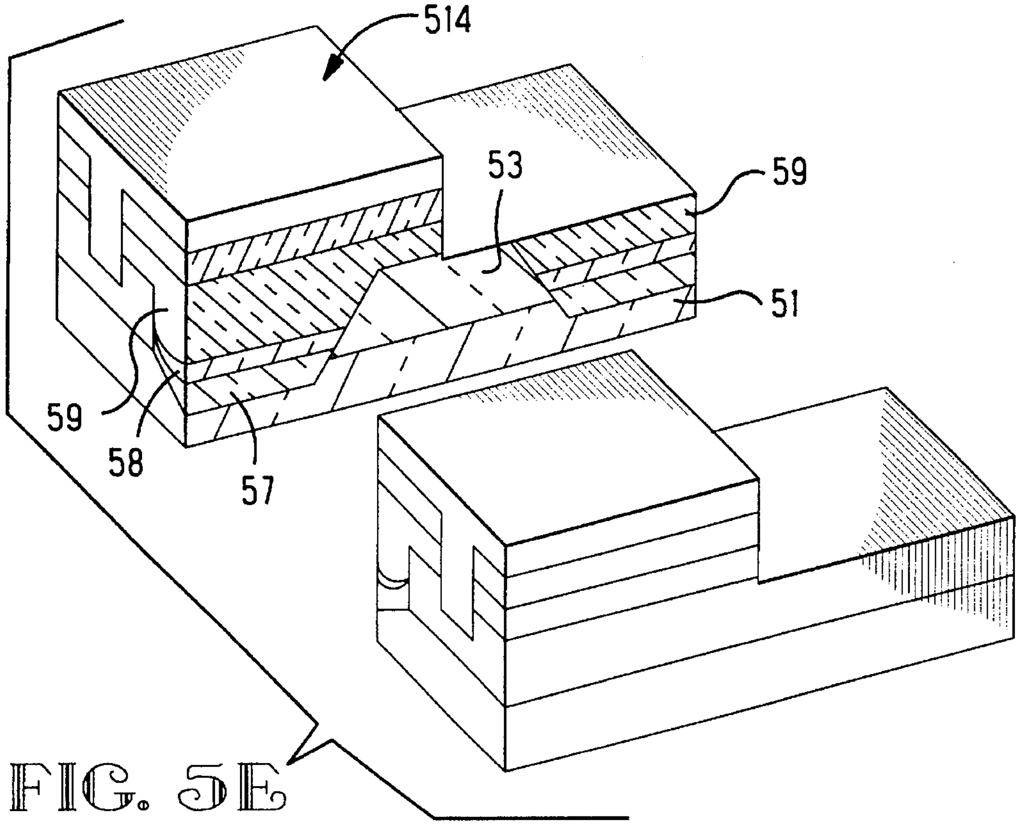
Figure 5F:
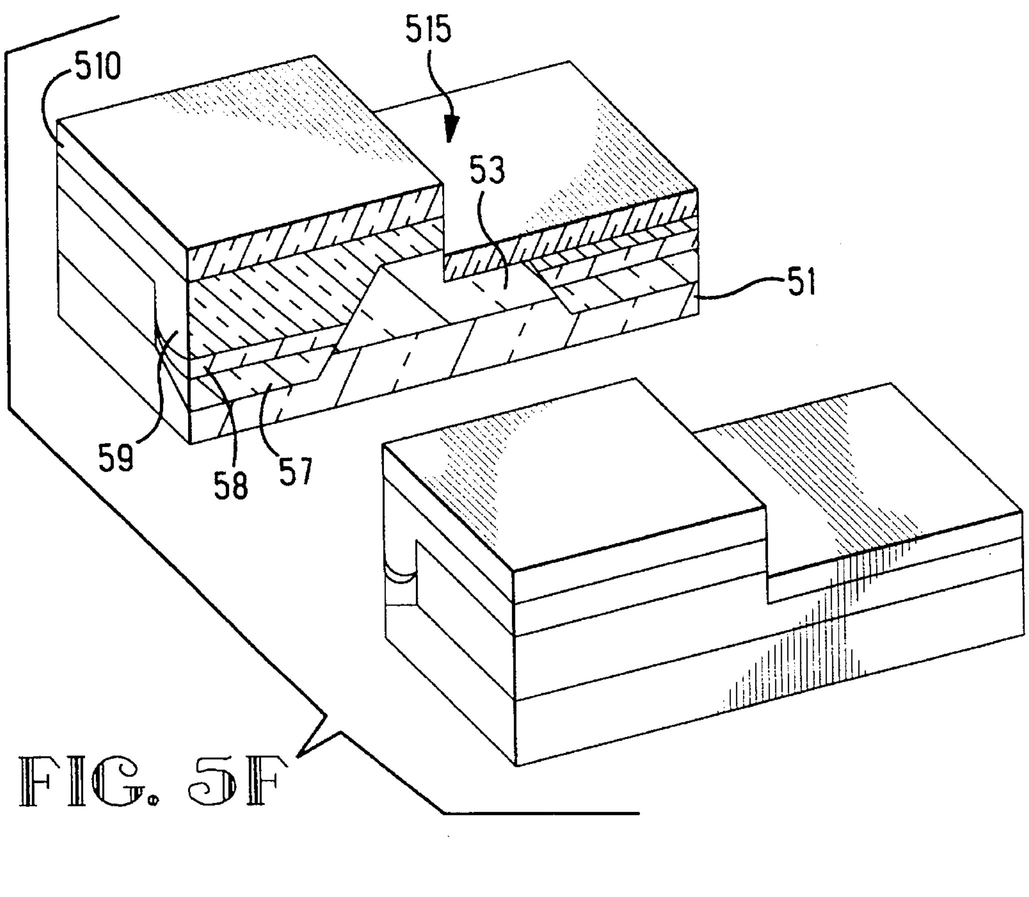

Turning to FIGS. *5a* through *5d*, we see the schematic cross section of the device fabrication of a buried crescent heterostructure ELED preferably employed to fabricate the present invention. The device is fabricated as follows. First we see in FIG. *5a*, a substrate 51 which is preferably n-InP wafer that is doped to a degree that it is conductive, for preferably having doping levels of approximately $\mathbf{10^{17}}$ to $\mathbf{10^{19}}$ $cm^{-1}$. A layer of high thermal conductivity semi-insulating material 52 (for example Fe doped InP) is epitaxially grown on the substrate 51 preferably by Metal Oxide Chemical Vapor Deposition (MOCVD), however techniques such as Liquid Phase Epitaxy (LPE), Molecular Beam Epitaxy (MBE) and Chemical Beam Epitaxy (CBE) are also possible techniques. Turning now to FIG. *5b*, we see the etched layers of the semi-insulating layer in order to effect the groove structure which advantageously divides the device into first and second regions with attendant advantages. The etching of the semi-insulating layer and the substrate as shown in FIG. *5b* is effected preferably by masking with an appropriate mask such as $SiO_2$ or silicon nitride followed by wet chemical etchant, however a dry etching method such as Reactive Ion Etching (RIE) is within the purview of the present invention. The epitaxial materials are grown first in a planar structure and then masked with dielectric or photoresist. The mask is patterned and partially removed. The exposed area is then etched by an isotropical etchant to leave a groove structure of the semi-insulating layer and substrate. The unetched semi-insulating portion 53 divides the device into a first and second region for discussion purposes. In any event, the grooves 54 are preferably in the dimension of a few microns in depth and a few hundred microns in length. It is critical that in the lateral dimension (the width) the grooves have an arrowhead or v-shape as at 55 to pinch off the active region in the ensuing regrowth. In the longitudinal direction the v-shape of the grooves facilitates the light diffusion as at 56. The desired orientations of the arrowhead 55 and the light diffusion surface 56 are effected by etching to reveal selected crystalline planes of the monocrystalline layers of the semi-insulating and substrate layers. By way of example, by choosing a (001) substrate, a 54.7 degree angle relative to the substrate is achieved with a (111) surface etch of the face 56 in the semi-insulating layer. The orientations described are merely exemplary, and it is clearly understood that other materials with other crystalline orientations are considered within the purview of the skilled artisan. Details of selective crystalline etching are found in U.S. Pat. No. 4,210,923 to North, et al., the disclosure of which is specifically incorporated herein by reference. The buried crescent heterostructure as shown in FIG. 5c is fabricated preferably as follows. The first cladding layer 57 which is preferably of InP is grown by preferably LPE and effects a concave surface in the region of the etched grooves at an increased growth rate over that of convex growth. Accordingly, the LPE is carried out for preferably 10–90 seconds along with the growth of the active/absorption layer 58 of n-InGaAsP in the first and second regions 511 and 512, of the device respectively, to form a concave structure as shown in a single high growth rate step. At this point, the second cladding layer of InP 59 is grown by a long LPE step, generally of a few minutes. This enables relatively planar growth of this layer 510 as is desired. Finally, a cap layer of n-InGaAsP is grown in a relatively fast planar growth step of about 20–30 seconds of LPE to form the planar layer as shown. It is of course possible to have differently doped materials for the differing materials. As the important factor being that the basic physics of an ELED be employed, it is considered within the purview of the skilled artisan to effect a device by differently doped materials as well as different III–V compounds. Finally, turning to FIG. 5d, we see the final version of a preferred embodiment of the instant invention. Partial etching of the cap, second cladding and the semi-insulating layers is carried out for reasons explained herein. The etching is achieved by masking selected regions of the structure with a dielectric or photoresist followed by a wet etch of isotropical etchant. The mask is then removed with a solution of HF, for example. The removal of these layers selectively enables operation of the device with the attendant advantage of preventing current flow to the absorption region. Thereby, any light which is transmitted through the diffusion surface from the active region will be absorbed more readily in this electrically unpumped region. Accordingly, the tendency of the device to lase is suppressed, and the device functions as a high speed ELED. A further preferred embodiment is as shown in FIG. 5d. To be specific, after the selective etching of the cap, second cladding and semi-insulating layers, a double channel 513 is revealed. The channel is etched via photolithographic techniques above described, using a dielectric or photoresist as a mask in the etching of the double channel in the first region 512 of the device and to etch the entire second region 513 of the device, as shown. Note the first and second regions 511 and 512 of the device are the imaginary division of the device with the unetched semi-insulating portion 53 as the division between the first and second regions (this terminology pertains throughout the disclosure with reference to the first and second regions). The double channel could be etched in the first region deeper than in the second region, and thereby to be within about two microns of the active layer. The heat generated in the active layer could be readily dissipated through the two microns of semi-insulating InP, and readily through a thermally conductive material deposited (described below in connection with FIG. 5e, below) in the channel and across the first region as shown. Choosing the channel to be etched within two microns of the active layer allows for heat dissipation without any appreciable absorption of the optical field (via the evanescent tail) of the active layer which tails off exponentially with distance at the semi-insulating layer/active layer interface. Were the channel in contact with the active layer, a metal material in the channel would be absorbed the optical field of the active layer to some extent, whereas in the instant invention, there is no appreciable absorption. Turning now to FIG. 5e, we see a deposited metal layer 514 as the heat sink. The metal layer is preferably an alloy of Ti-Pt-Au or Au-Zn-Au for a p-type cap layer. For an n-cap layer it is preferred to use an alloy of AuGe-Ni-Au or Ge-Au-Ni-Au. The layers are deposited by standard plating or evaporation techniques. The heat generated in the active layer is dissipated across the semi-insulating layer and through the thermally conductive layer enabling the device to operate at nearly linear light output versus current input characteristic. This method of heat dissipation is not possible with the structure of the prior art as for example an n-cap, p-n-p-n blocking layer, the thermally conductive layer would short the n-cap and the n blocking layers. Finally, the device as shown in FIG. 5f has no heat dissipating channel and is fabricated above with the steps toward the channel fabrication eliminated. The layer of dielectric is shown as 515.

The benefits of such a structure are as described presently. First, this structure minimizes the area of the pn junctions through mesa structure, and has the benefit thereby of reducing the ill-effects of pn junction capacitance. Secondly, the deposition of a semi-insulating layer as the isolating layer serves as well to decrease the capacitance between the p-electrode and the n-electrode, outside the mesa region. The advantage of having a reduction in the overall intrinsic capacitance of the ELED is the great reduction in rise and fall time of the device due to a reduction in the device RC time constant. Reducing the RC time constant increases the switching speed, and in the realm of nearly square-wave digital signals faster rise and fall response times will result in higher frequency devices with greatly enhanced communication bandwidths. This ELED as designed experiences rise and fall times on the order of 0.5 nanoseconds. This rapid switching capability has resulted in a bandwidth of over 700 MHz.

Another benefit of the present device design is its capability to dissipate the joule heat generated in operation. Joule heating in conventional light emitting devices results in non-linear light output power versus bias currents. The structure of the present invention has the ability to dissipate heat through two paths. Turning to FIGS. 5 and 6, the layer of semi-insulating InP which has a thermal conductivity of approximately 0.68 watt-$cm^{-1}$-$K^{-1}$ forms one path. The layer 65 has the same thermal expansion coefficient and lattice constant as the n-doped InP substrate, and can thereby be grown to any desired thickness, which has obvious ramifications relative to the degree of electrical isolation as well as the ability of the device to dissipate heat. For example, this could be a layer of Fe-doped InP exhibiting a resistivity in the range $10^6$–$10^{10}$ Ohm-cm, however other materials could be used in keeping with the theme and spirit of the invention. The dissipation of heat away from the pn junctions of the mesa structure allows the device to operate at high injection current levels without significant heating of the pn junctions, thereby improving the light output power linearity with respect to bias current.

Turning now to FIGS. 6a–6f, we see the fabrication steps of the present invention in a buried mesa heterostructure. There are two methods preferred to fabricate the buried mesa structure device, and each will be discussed separately.

Figure 6A:
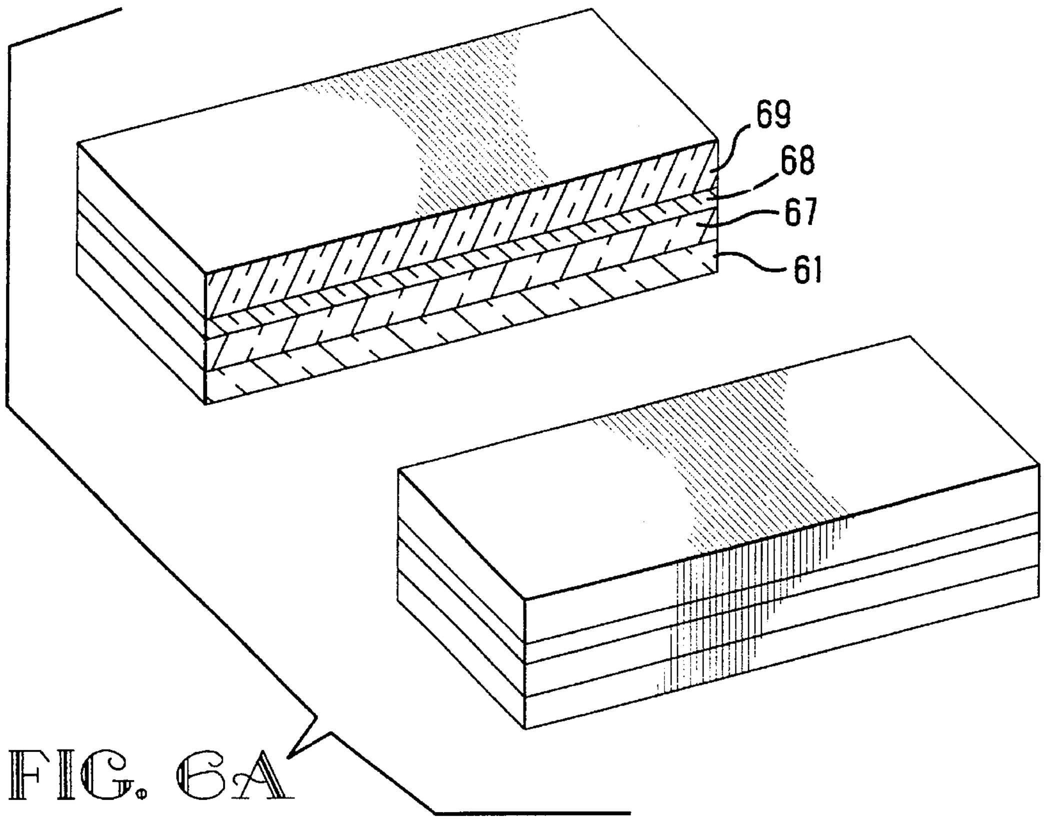
Figure 6B:
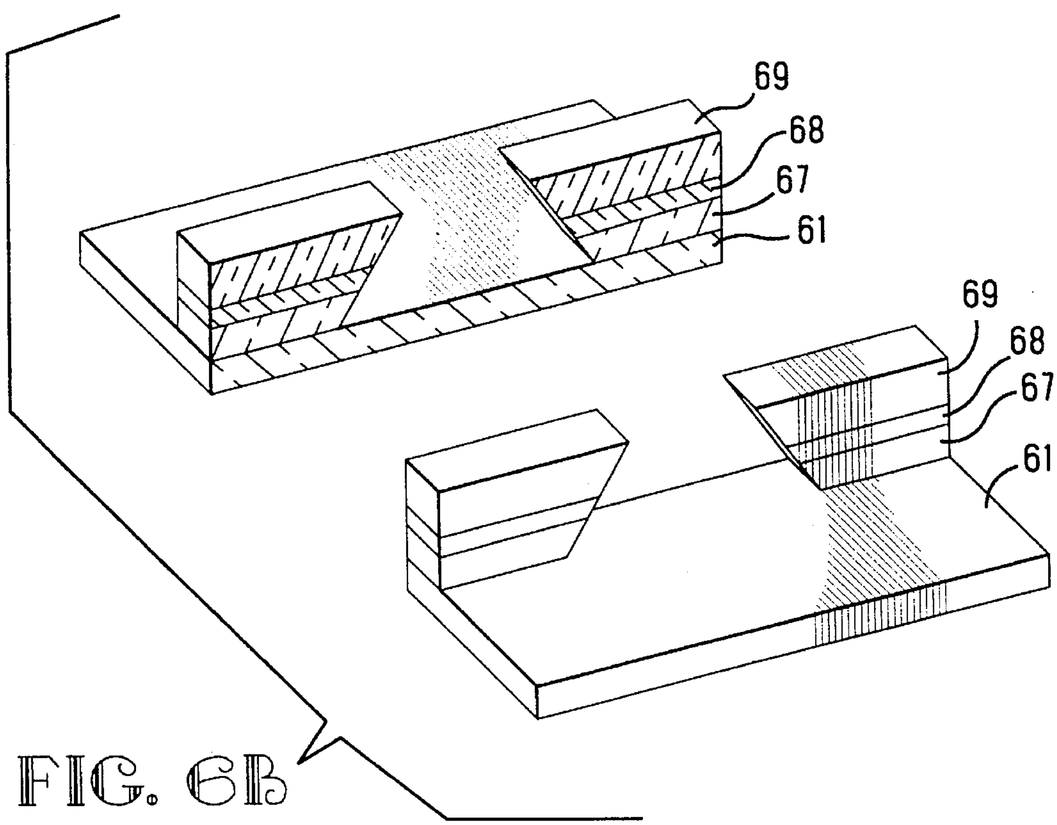
Figure 6C:
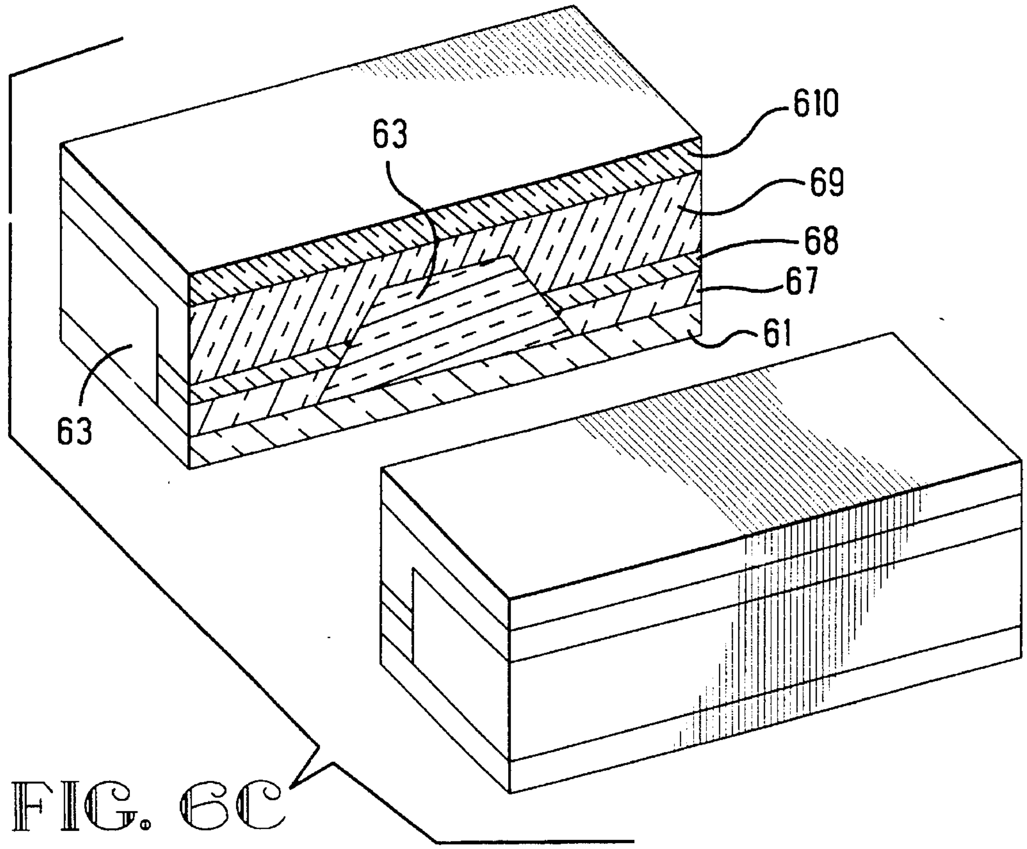
Figure 6D:
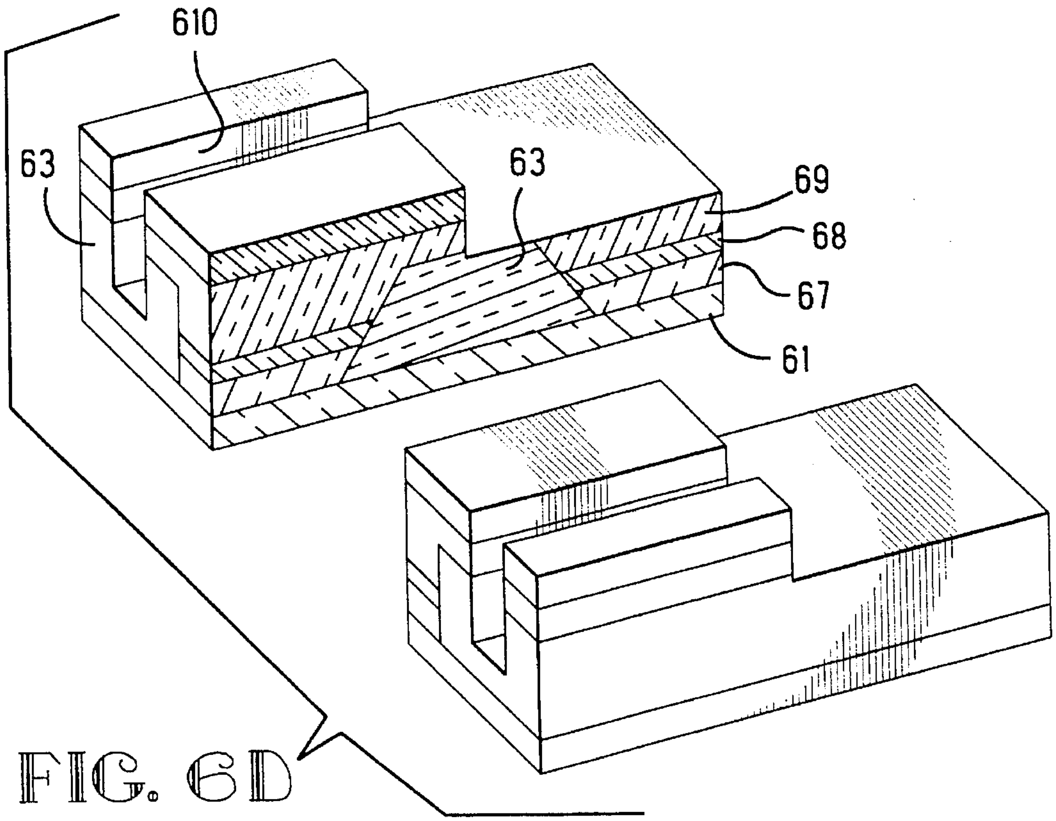
Figure 6E:
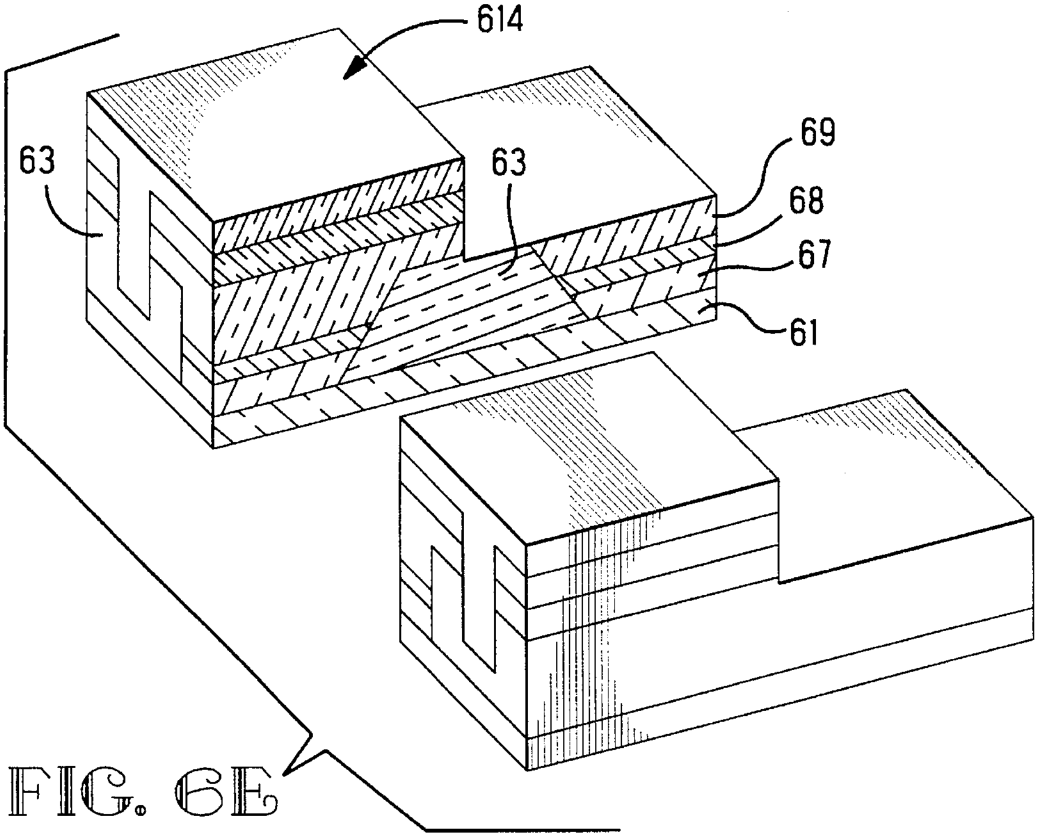
Figure 6F:
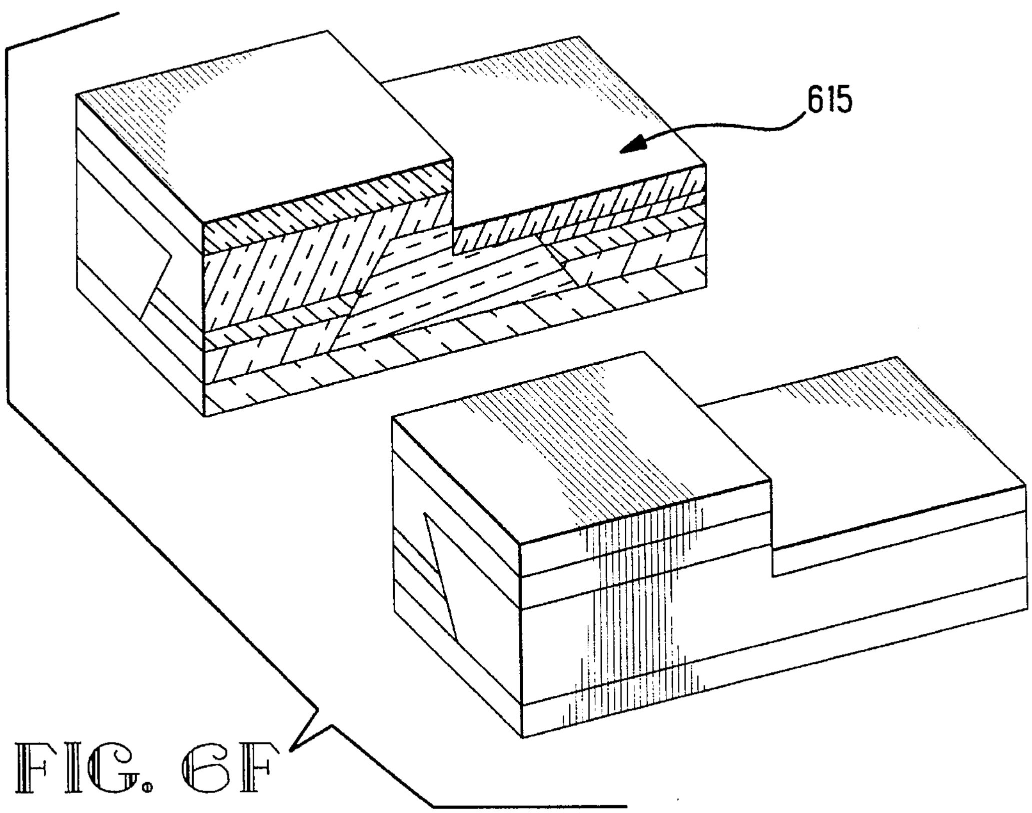

Turning first to FIG. 6*a*, we see the planar layers of substrate 61, first cladding layer 67, active layer 68 and second cladding layer 69 which are preferably deposited by MOCVD, however LPE, MBE or CBE will work. The layers are identical in materials doping types and doping levels as were stated above relative to the buried crescent device. Succinctly, for an InP n-substrate, an n-InP first cladding layer, an InGaAsP active layer and a p-InP second cladding layer, the first cladding layer is doped with S, Si or Sn as described above. The active layer is undoped/unintentionally doped or intentionally doped with Zn which serves to decrease carrier lifetime and increase the bandwidth of the device. Accordingly, bandwidth is increased by decreasing intrinsic capacitance as well as by selective doping of the active layer. However, care must be taken to not dope the active layer too greatly, as light intensity is adversely affected by too high of doping levels. The present invention enables increasing bandwidth even with an undoped/unintentionally doped active layer by virtue of the reduced capacitance. Finally, the second cladding layer is doped p-type with Zn as described above. Turning now to FIG. 6*b*, we see the etched structure. Etching is effected by photolithography preferably using patterned dielectric to mask the desired regions of the layers. The preferred etchant is HCl, however mixtures of HCl and $H_3PO_4$ are also possible. The etching again makes use of the characteristic planes of monocrystalline material, and the light diffusion surfaces are readily effected by etching to reveal the (111) planes. The dielectric is removed by HF solution. Turning now to FIG. 6*c*, we see the growth of the various layers of the device. The preferred technique is LPE, however, MOCVD, MBE or CBE are also possible. By the very nature of LPE, the growth rate in a concave surface is much faster than in a planar or convex surface, the semi-insulating layer 63 could be grown in the non-mesa region with no growth at the top of the mesa. After the semi-insulating layer is grown to result in a nearly planar wafer, the p-cladding 67, 69 and p-cap layers 610 are grown in planar form thereon. The semi-insulating layer is doped preferably with Co at a concentration of $10^{19}/cm^3$. The preferred dopant for the p-cap layer is Zn in concentration of $10^{19}/cm^3$. FIGS. 6*d* and 6*e* show the etching to effect the double channel 614 heat sink. As the etching and deposition of a thermally conductive layer is identical to the description associated with FIGS. 5*d* and 5*e*, it will not be repeated. The dielectric layer is shown at 615.

Figure 7A:
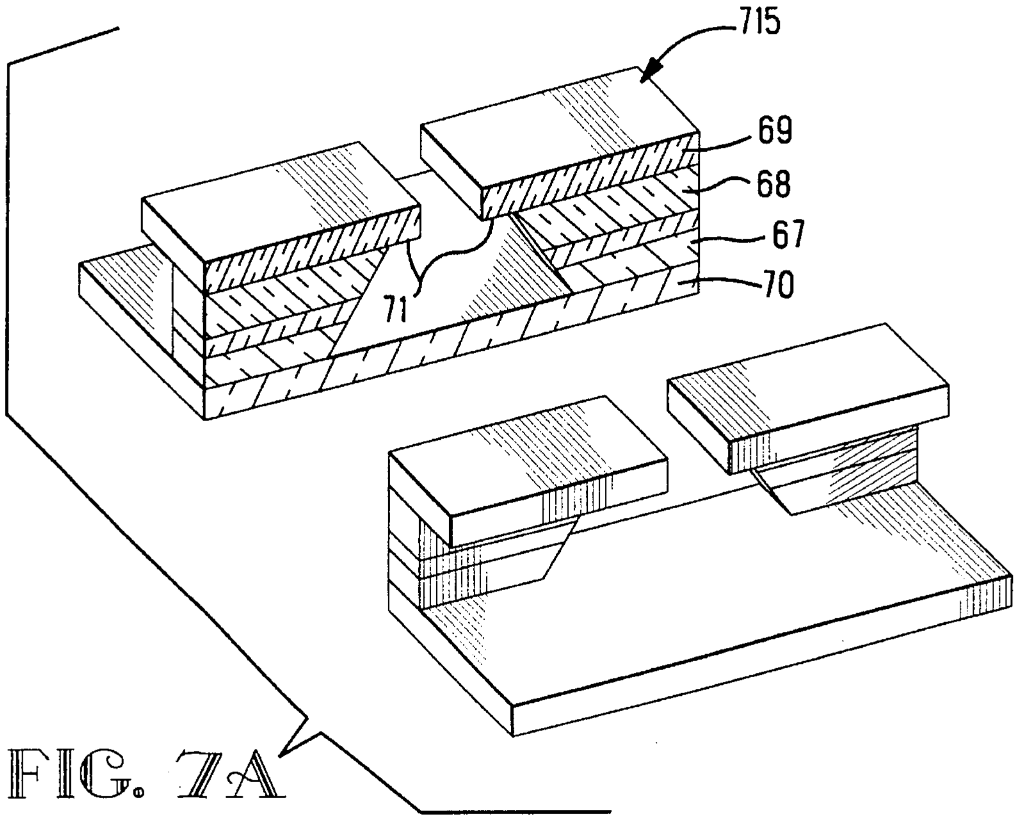
Figure 7B:
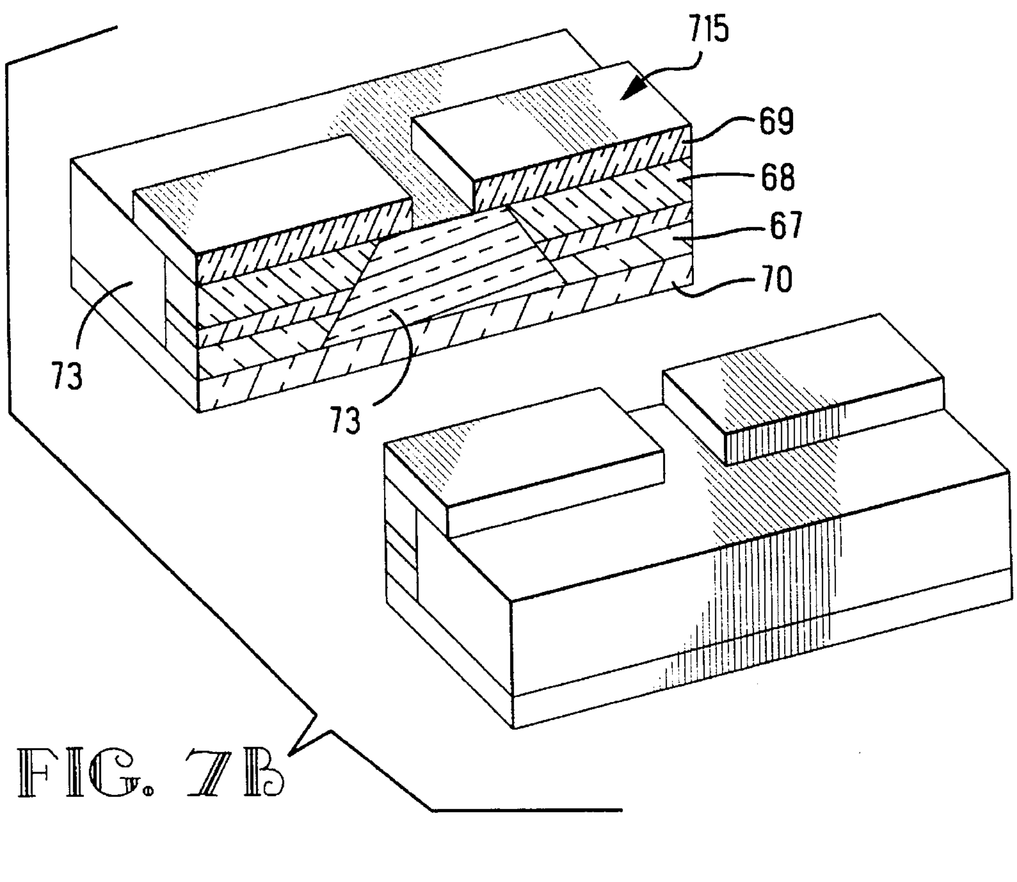

Turning now to FIGS. 7*a* and 7*b*, we see alternative steps to that shown in the fabrication steps shown and described relative to FIG. 6*b*. Clearly, the same etching is performed in FIG. 7*a*, with a dielectric layer as a mask in the etching of the mesas. However, instead of removing the dielectric layer 715, it is left on during epitaxial growth of the semi-insulating layer so as to serve as a growth inhibitor. The layer of dielectric is deposited so that after etching, it overhangs the mesas as at 71. This structure will allow epitaxial growth of the semi-insulating layer 73 on the substrate 70, but will prevent its growth on the second cladding layer 73. The structure that results is as shown in FIG. 7*b*. The preferred technique is growth of the semi-insulating layer, preferably Fe-doped InP, by MOCVD, however LPE, MBE and CBE. Also, as described previously, other dopants are possible if not necessary given the desired substrate for a given structure. The doping concentrations are as stated previously. The growth of the semi-insulating layer is grown to planarize the wafer. After the growth of the semi-insulating layer the structure results as is shown in FIG. 7*b*, and the layer of dielectric layer is removed by HF. The cladding layers, active layer, cap layer are as described previously, and the structure can be further processed to effect the heat sink as described above.

Having described the preferred embodiments, it is clear that there are various techniques for fabrication as well as materials and dopants that are considered within the purview of the artisan of ordinary skill. Such variations of the instant teachings contained herein are considered within the theme and spirit of the invention.

We claim:

1. A semiconductor edge emitting light emitting diode, comprising:

(a.) A substrate having an upper surface, a lower surface and a selected thickness therebetween;

(b.) A layer of semi-insulating material disposed on said upper surface of said substrate, said layer of said semi-insulating material and said substrate being selectively etched to form grooves about an unetched portion of said semi-insulating material;

(c.) A first layer of cladding disposed on said upper surface of said substrate, said first layer of cladding selectively deposited in said grooves;

(d.) A layer of semiconductor material disposed on top of said first cladding layer and in said grooves;

(e.) A second layer of cladding material disposed on top of said semiconductor material and in said grooves; and (f.) A cap layer disposed on top of said semiconductor material, said cap layer forming an ohmic contact for said diode.

2. A semiconductor light emitting diode as recited in claim 1, wherein a selected portion of said semiconductor layer is an active layer.

3. A semiconductor light emitting diode as recited in claim 2, wherein said active layer is a buried crescent structure.

4. A semiconductor light emitting diode as recited on claim 1, wherein a selected portion of said semiconductor layer is a light absorbing material.

5. A semiconductor light emitting device as recited in claim 1, wherein said substrate is p-doped to form an ohmic contact and said cap layer is n-doped.

6. A semiconductor edge emitting light emitting diode as recited in claim 1, wherein said active layer and said semi-insulating layer interface at an angle so as to reduce back reflection into said active layer.

7. A semiconductor edge emitting light emitting diode as recited in claim 1, wherein said light absorbing material and said semi-insulating layer interface at an angle so as to reduce back reflection into said light absorbing material.

8. An edge emitting light emitting diode, comprising:

(a.) A substrate having a top surface, a bottom surface and a selected thickness therebetween;

(b.) A layer of semi-insulating material disposed on said upper surface of said substrate, said layer of said semi-insulating material and said substrate being selectively etched to form grooves about an unetched portion of said semi-insulating material, said unetched portion substantially dividing said diode into a first region and a second region;

(c.) A first cladding layer disposed in one of said grooves in said first region and in one of said grooves in said second region;

(d.) An active layer of semiconductor material disposed in one of said grooves in said first region, said active layer disposed on said first cladding layer;

(e.) A layer of optically absorbing material disposed on said first cladding material in one of said grooves in said second region of said diode;

(f.) A second cladding layer disposed on said active layer in one of said grooves in said first region and on said optically absorbing material in said second region of said diode; and (g.) A cap layer disposed on said second cladding layer in said second region.

9. An edge emitting light emitting diode as recited in claim 8, wherein said active layer and said semi-insulating layer interface at an angle so as to reduce back reflection in said active layer.

10. An edge emitting light emitting diode as recited in claim 8, wherein said light absorbing layer and said semi-insulating layer interface at an angle so as to reduce back reflection in said light absorbing layer.

11. An edge emitting light emitting diode as recited in claim 8, wherein a channel is etched into said cap, second cladding and semi-insulating layers in said first region, said channel in thermal communication with said active layer, and a thermally dissipating material is disposed in said channel for dissipating heat generated in said active layer out of said active layer.

* * * * *